United States Patent
Krivonak et al.

(10) Patent No.: US 10,032,693 B2
(45) Date of Patent: Jul. 24, 2018

(54) HEAT TRANSFER CHASSIS AND METHOD FOR FORMING THE SAME

(71) Applicant: General Electric Company, Schenectady, NY (US)

(72) Inventors: Andrew Louis Krivonak, Erie, PA (US); Shreenath Shekar Perlaguri, Bangalore (IN); Rajendra Yammanuru, Bangalore (IN); Arunpandi Radhakrishnan, Bangalore (IN); Theodore Clark Brown, Ripley, NY (US)

(73) Assignee: General Electric Company, Schenectady, NY (US)

( * ) Notice: Subject to any disclaimer, the term of this patent is extended or adjusted under 35 U.S.C. 154(b) by 203 days.

(21) Appl. No.: 14/918,082

(22) Filed: Oct. 20, 2015

(65) Prior Publication Data

US 2017/0112020 A1 Apr. 20, 2017

(51) Int. Cl.
*H01L 23/40* (2006.01)
*H01L 23/467* (2006.01)
*H01L 23/473* (2006.01)
*B23K 1/00* (2006.01)
*H05K 7/20* (2006.01)

(52) U.S. Cl.
CPC .............. *H01L 23/467* (2013.01); *B23K 1/00* (2013.01); *H01L 23/473* (2013.01); *H05K 7/20927* (2013.01); *H05K 7/20918* (2013.01)

(58) Field of Classification Search
CPC . H01L 23/467; H01L 23/473; H05K 7/20918; H05K 7/20927; H05K 5/0291; F28F 9/0292

USPC ................. 361/710, 711, 696, 697
See application file for complete search history.

(56) References Cited

U.S. PATENT DOCUMENTS

| 3,851,221 | A | | 11/1974 | Beaulieu et al. | |
|---|---|---|---|---|---|
| 5,424,916 | A | * | 6/1995 | Martin | H05K 7/20636 165/80.4 |
| 5,482,109 | A | * | 1/1996 | Kunkel | F28F 3/02 165/185 |
| 5,582,238 | A | * | 12/1996 | Plaschkes | F24D 3/142 165/171 |
| 6,046,921 | A | * | 4/2000 | Tracewell | H05K 7/20918 361/696 |
| 6,430,044 | B2 | * | 8/2002 | Hutchinson | H05K 7/1424 361/690 |

(Continued)

*Primary Examiner* — Devon Russell
(74) *Attorney, Agent, or Firm* — GE Global Patent Operation; John A. Kramer

(57) ABSTRACT

A system includes a front plate, a manifold cover, and bridge heat sinks. The manifold cover is secured to the front plate to define a fluid distribution chamber along a front side of the front plate. The manifold cover defines a port opening through which a cooling fluid is received from outside of the manifold cover. The bridge heat sinks extend rearward from a back side of the front plate. The bridge heat sinks define fluid channels that are fluidly connected with the fluid distribution chamber through corresponding slots in the front plate. The fluid distribution chamber is configured to distribute the cooling fluid received from outside of the manifold cover through the fluid channels of the bridge heat sinks in order to cool one or more electronics packages disposed along the bridge heat sinks without the cooling fluid engaging the one or more electronics packages.

22 Claims, 5 Drawing Sheets

(56) References Cited

U.S. PATENT DOCUMENTS

| | | | | |
|---|---|---|---|---|
| 6,483,700 B1* | 11/2002 | Malone | .............. | H05K 7/20563 |
| | | | | 174/15.1 |
| 6,721,182 B1* | 4/2004 | Wells | .................. | H05K 7/1404 |
| | | | | 257/727 |
| 7,201,218 B2* | 4/2007 | Hiyama | ................ | F28F 9/0224 |
| | | | | 165/173 |
| 7,508,670 B1* | 3/2009 | Thorson | ............. | H05K 7/20636 |
| | | | | 165/104.33 |
| 7,796,389 B2 | 9/2010 | Edmunds et al. | | |
| 8,441,793 B2* | 5/2013 | Dunwoody | ........ | H05K 7/20781 |
| | | | | 165/104.26 |
| 8,611,088 B2* | 12/2013 | Barna | ................ | H05K 7/20145 |
| | | | | 165/104.33 |
| 8,730,673 B2 | 5/2014 | Vas et al. | | |
| 8,797,739 B2 | 8/2014 | Brandenburg et al. | | |
| 9,426,931 B2* | 8/2016 | Kaplun | ................... | B23P 15/26 |
| 9,651,315 B2* | 5/2017 | Cui | ........................ | F28F 3/027 |
| 2007/0070601 A1* | 3/2007 | Vos | .................... | H05K 7/20563 |
| | | | | 361/694 |
| 2009/0147472 A1* | 6/2009 | Mantych | ............. | H05K 7/1404 |
| | | | | 361/694 |
| 2009/0213543 A1* | 8/2009 | Nemoz | ............. | H05K 7/20563 |
| | | | | 361/694 |
| 2015/0053384 A1* | 2/2015 | Ishibashi | ............... | F28F 9/0265 |
| | | | | 165/173 |
| 2015/0303881 A1* | 10/2015 | Blednov | ................. | H03F 3/213 |
| | | | | 330/289 |

\* cited by examiner

US 10,032,693 B2

HEAT TRANSFER CHASSIS AND METHOD FOR FORMING THE SAME

FIELD

Embodiments of the subject matter described herein relate to a chassis that transfers heat away from electronic components held by the chassis.

BACKGROUND

Various vehicle systems and industrial machinery have control units that house electronic control components within a case. In the context of a rail vehicle, a control unit may be located on a locomotive. The electronic control components held in the control unit may be processing components (e.g., central processing unit or CPU), input/output components, power control components, tractive and/or braking control components, heating and/or cooling control components, and the like. The electronic control components may include circuit boards and electronic devices electrically connected to the circuit boards. During operation, the electronic control components may generate significant heat within the case of the control unit. The heat may negatively affect operation of the electronic control components, and potentially may damage the electronic control components.

In order to dissipate heat away from the electronic control components, some known control units may direct an air stream through the case such that the flowing air absorbs heat through conduction before the air is exhausted out of the case. The flowing air may include dirt, debris, moisture, or other contaminants that may damage the electronic control components if the air contacts the electronic control components. For example, in a vehicle application, the air directed through the control unit may be ambient air from the environment that the vehicle system is traveling through. It may be cost prohibitive to sufficiently filter and condition the ambient air prior to directing the air through the control unit.

BRIEF DESCRIPTION

In one embodiment, a system (e.g., a heat transfer chassis) includes a front plate, a manifold cover, and bridge heat sinks. The front plate has a front side and a back side. The front plate defines multiple slots through the front plate between the front and back sides. The manifold cover is secured to the front plate to define a fluid distribution chamber along the front side of the front plate. The manifold cover defines a port opening through which a cooling fluid is received from outside of the manifold cover. The bridge heat sinks extend rearward from the back side of the front plate. The bridge heat sinks define fluid channels that are fluidly connected with the fluid distribution chamber through the corresponding slots of the front plate. The fluid distribution chamber is configured to distribute the cooling fluid received from outside of the manifold cover through the fluid channels of the bridge heat sinks in order to cool one or more electronics packages disposed along the bridge heat sinks without the cooling fluid engaging the one or more electronics packages.

In another embodiment, a method (e.g., for forming a heat transfer chassis) includes coupling a plurality of bridge heat sinks between a front plate and a rear plate to form a chassis assembly. The bridge heat sinks each include a base plate and a fin plate that engage one another at a respective top interface and a respective bottom interface and define a fluid channel laterally therebetween that extends through the bridge heat sink. Front openings of the fluid channels of the bridge heat sinks are fluidly connected to corresponding front slots defined through the front plate. Rear openings of the fluid channels are fluidly connected to corresponding rear slots defined through the rear plate. The bridge heat sinks are laterally spaced apart from one another to define cavities between pairs of adjacent bridge heat sinks. The method also includes applying a metallic filler material to the chassis assembly at the top interfaces and the bottom interfaces of the bridge heat sinks and at front and rear chassis joints of the chassis assembly. The front chassis joints are defined between the bridge heat sinks and the front plate. The rear chassis joints are defined between the bridge heat sinks and the rear plate. The method further includes brazing the chassis assembly to form a unitary chassis body. The metallic filler material fuses the base plates to the respective fin plates of the bridge heat sinks at the respective top and bottom interfaces. The metallic filler material fuses the bridge heat sinks to the front plate and to the rear plate at the front chassis joints and rear chassis joints, respectively.

DETAILED DESCRIPTION

Figure 1:
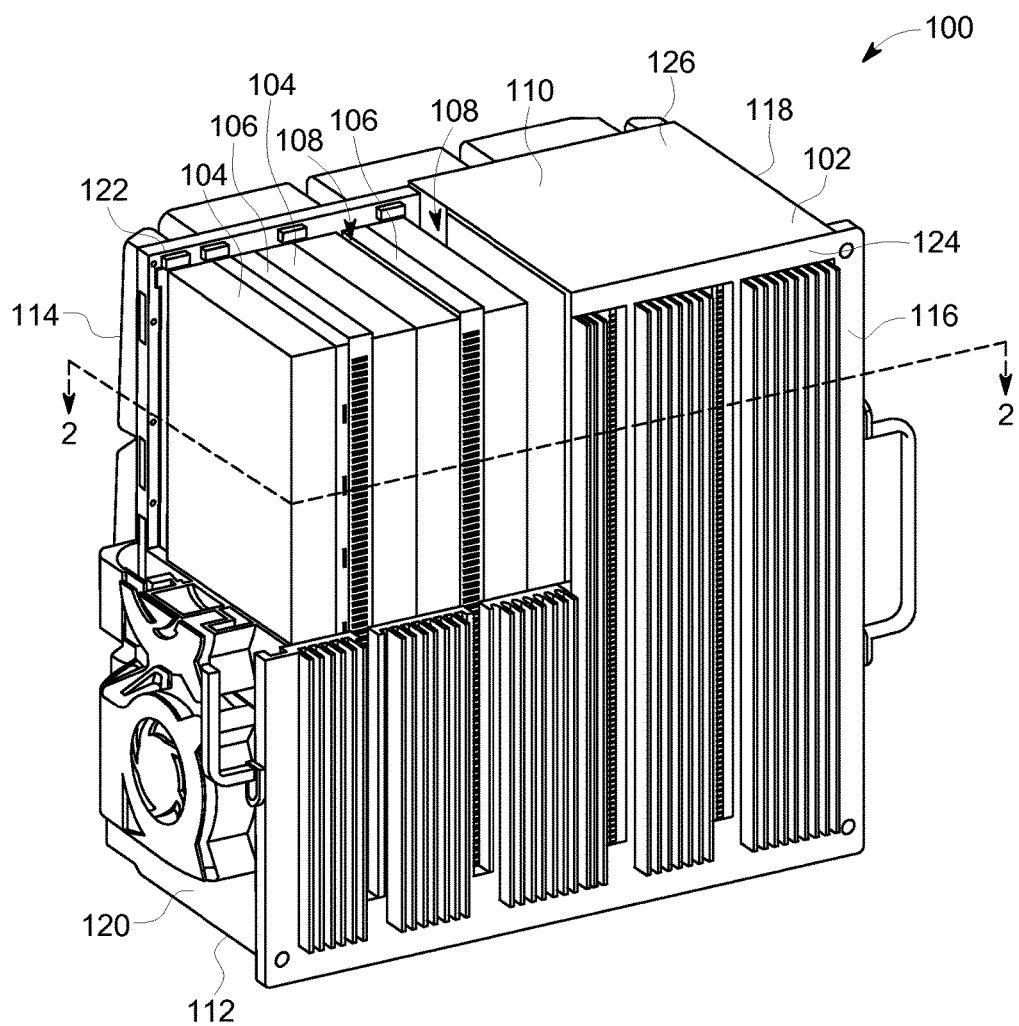
FIG. 1 is a perspective, partial cut-away view of an electronics system according to an embodiment.

As used herein, an element or step recited in the singular and proceeded with the word "a" or "an" should be understood as not excluding plural of said elements or steps, unless such exclusion is explicitly stated. Furthermore, references to "one embodiment" of the present inventive subject matter are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

As used herein, the terms "system," "device," or "unit" may include a hardware and/or software system that operates to perform one or more functions. For example, a unit, device, or system may include a computer processor, controller, or other logic-based device that performs operations based on instructions stored on a tangible and non-transitory computer readable storage medium, such as a computer memory. Alternatively, a unit, device, or system may include a hard-wired device that performs operations based on hard-wired logic of the device. The units, devices, or systems shown in the attached figures may represent the hardware that operates based on software or hardwired instructions, the software that directs hardware to perform the operations, or a combination thereof. The systems, devices, or units can include or represent hardware circuits or circuitry that include and/or are connected with one or more processors, such as one or computer microprocessors.

Embodiments of the subject matter disclosed herein describe one or more heat transfer chassis and methods of making the same. In one or more embodiments, a heat transfer chassis is an assembly of heat exchangers with thermally-conductive interfaces or joints between intersecting heat exchangers. The heat transfer chassis does not require gaskets at the joints to prevent leaking. The heat transfer chassis acts as a manifold to receive cold air in one end, distribute the cold air to internal heat exchangers which conduct heat away from electronics, and exhaust the heated air out a second end.

In one embodiment, a heat transfer chassis includes multiple internal heat exchangers. Each heat exchanger is formed from two discrete pieces that are brazed together to create a single heat exchanger having an array of fins to increase heat transfer. The internal heat exchangers are stacked between a conductive front plate and a conductive back plate. A hollow cover is mounted to the front face of the front plate to define a manifold that receives air from fans and distributes the air to each of the internal heat exchangers through slots in the front plate. The front face of the front plate includes pin fins to provide additional convective cooling surface area with minimal air friction. The back plate defines a number of slots equal to the number of internal heat exchangers and aligning with the heat exchanges to allow the heated air that exits each internal heat exchanger to exhaust through the back plate to the ambient air. A back face of the back plate includes vertical fins to provide additional convective cooling surface area. All of these components (e.g., the internal heat exchangers, the front plate, the rear plate, and the cover) are then dip-brazed together (as an assembly) with a filler material disposed along each contact interface. Dip-brazing the assembly forms a single, one-piece (e.g., unitary) chassis body or structure which requires no gaskets or other means to prevent air leaks at joints. The chassis body has a thermally conductive interface (e.g., defined at least in part by the filler material) between each part to allow a substantial entirety of the surface area of the chassis body to conduct heat away from the electronics for increased heat dissipation to the ambient air (e.g., relative to chassis structures that have less of a percentage or amount of conductive material along the surface area). The interfaces are also electrically conductive, which allow the chassis to function as a grounding source or path for the electronics held by the chassis. In one non-limiting example embodiment, the chassis includes four internal heat exchangers for cooling and accommodating seven printed circuit boards (or other electronic devices). However, the size of the chassis can be scaled up or down based on type, quantity, and size of the electronics to be cooled, quantity of power to dissipate, and quantity of available air for cooling. In addition, the interfaces between the internal heat exchangers and the electronics can be tuned to accommodate the design characteristics of the electronics (e.g., sizes, shapes, orientations, and arrangements of the electrical components). Some electronics packages have an entire face available for engaging the internal heat exchanger to transfer heat to the internal heat exchanger. The electronics package may contact the heat exchangers directly or indirectly via the use of a thermal interface material between the face of the heat exchanger and the face of the electronic package. Other electronics packages may require edge conduction based on constraints from the device layout of the circuit board, such as due to electrical components being arranged on both faces of the circuit board.

One or more embodiments of the heat transfer chassis described herein provide distribution of cooling air from a single source to multiple heat exchangers. The number of heat exchangers can be scaled to accommodate various sizes and quantities of electronics. The heat exchangers receive a cooling fluid through internal channels, and the cooling fluid in the channels does not contact or interact directly with the electronics held by the chassis, which maintains cleanliness and reliability of the electronics over the life of the chassis. In addition, the heat exchanger geometry can be tuned to accommodate various cooling approaches driven by the geometry of the electronics, such as by providing edge conduction or face conduction between an electronics package and an internal heat exchanger. Furthermore, the interfaces between the components of the chassis (e.g., panels, plates, and heat exchangers) are thermally conductive, which increases an amount of surface area of the chassis that conducts heat away from the electronics into the cooling fluid. The interfaces are sealed to prevent leaks from the cooling fluid, without using gaskets or epoxies. The interfaces are also electrically conductive, so the chassis defines a conductive path between the internal heat exchangers and plates at either end of the heat exchangers. The electrically conductive interfaces allow the chassis to be used for grounding the electronics.

A more particular description of the inventive subject matter briefly described above will be rendered by reference to specific embodiments thereof that are illustrated in the appended drawings. The inventive subject matter will be described and explained with the understanding that these drawings depict only typical embodiments of the inventive subject matter and are not therefore to be considered to be limiting of its scope. Wherever possible, the same reference numerals used throughout the drawings refer to the same or like parts. The various embodiments are not limited to the arrangements and instrumentality shown in the drawings.

FIG. 1 is a perspective, partial cut-away view of an electronics system 100 according to an embodiment. The electronics system 100 includes a chassis system 102 and one or more electronics packages 104 that are held on the chassis system 102. The chassis system 102 is referred to as "chassis 102" herein. The chassis 102 is configured to secure and hold the electronics packages 104. The chassis 102 provides cooling for the electronics packages 104 by receiving heat generated by the electronics packages 104 and passively transferring the heat to a cooling fluid flowing through the chassis 102. The chassis 102 defines a closed fluid circuit such that the cooling fluid does not directly engage the electronics packages 104. For example, the chassis 102 defines barriers between the cooling fluid and the electronics packages 104 that are permeable to heat transfer but are not permeable to mass transfer. Thus, heat may be transferred across the barriers to be absorbed by the cooling fluid, without allowing molecules of the cooling fluid to migrate across the barrier to the electronics packages 104. By mechanically separating the cooling fluid from the electronics packages 104, the electrical components on the electronics packages 104 are not exposed to dust, dirt, debris, moisture, or other contaminants that may be present in the cooling fluid. In addition, due to the closed system, filtering and/or conditioning the cooling fluid prior to the cooling fluid flowing through the chassis 102 may not be required. Thus, ambient air may be used as the cooling fluid without first filtering the air (to remove dust and dirt) and/or conditioning the air (to reduce humidity).

The electronics packages 104 held by the chassis 102 may provide control functions, communication functions, data storage functions, data processing functions, or the like. Once or more electronics packages 104 may include or represent hardware circuits or circuitry that include and/or are connected with one or more processors, such as one or computer microprocessors. One or more electronics packages 104 may be or include a substrate, such as a printed circuit board. In particular embodiments, the substrate may be a portion of a processor. The electronics packages 104 may include one or more electrical components mounted to the substrate, such as processing devices (e.g., microprocessors, central processing units (CPUs), or the like), control devices, memories, input/output devices, power supply devices, or the like. Different electronics packages 104 may have different functions in a particular application.

The electronics system 100 is modular and may be used in various applications. For example, the electronics system 100 may be mounted in an aircraft, a land vehicle, or a water vessel during a trip. The land vehicle may be an automobile, a rail vehicle, or an off-highway vehicle (OHV) (e.g., a vehicle system that is not legally permitted and/or designed for travel on public roadways). The electronics system 100 may alternatively be used with industrial machinery, such as to control machinery in a manufacturing plant or an assembly plant. In another embodiment, the electronics system 100 may be used in a data storage or data processing facility.

In one application, the electronics system 100 is a control unit of a rail vehicle system that includes multiple rail vehicles coupled together to travel together along a route defined by a track. The electronics system 100 may be disposed on a propulsion-generating vehicle (e.g., a locomotive) of the rail vehicle system. One or more electronics packages 104 held by the chassis 102 may be used to control tractive and/or braking efforts of the rail vehicle system by generating tractive and/or braking settings of the rail vehicle system as a function of location along the route. For example, the electronics packages 104 may generate or at least implement a trip plan for the rail vehicle system. The trip plan designates one or more operational settings for the rail vehicle system to implement or execute during a trip as a function of time and/or location along the route. The operational settings may include dictated speeds, throttle settings, brake settings, accelerations, or the like, of the rail vehicle system. Other electronics packages 104 may be used for communicating with a remote location, such as a dispatch, a wayside device, another rail vehicle system, or another vehicle in the same rail vehicle system. Still other electronics packages 104 may function to track and monitor progress of the rail vehicle system during movement along the route, such as by measuring, recording, and/or receiving data parameters regarding the movement of the rail vehicle system along the route, such as route information, location information, speed information, and the like.

In an embodiment, the electronics system 100 houses at least five electronics packages 104. Each electronics package 104 is or includes an inverter for driving a traction motor. The electronics packages 104 together consume a minimum of 2000 kW for driving the traction motor. For example, the electronics packages 104 may consume a combined 5000 kW. In an embodiment, the system 100 houses at least eight electronics packages 104 which collaboratively control a locomotive engine. The chassis 102 may be configured to dissipate up to 400 W or more of heat generated by the electronics packages 104.

The electronics system 100 has a top 110, a bottom 112, a front 114, a rear 116, a first side 118, and an opposite second side 120. As used herein, relative or spatial terms such as "top," "bottom," "front," "rear," "first," and "second" are only used to distinguish the referenced elements and do not necessarily require particular positions or orientations in the chassis 102, the electronics system 100, or in the surrounding environment of the electronics system 100. The chassis 102 includes multiple bridge heat sinks 106 that are spaced apart laterally from one another to define a corresponding cavity 108 between each pair of adjacent bridge heat sinks 106. The electronics packages 104 are held by the chassis 102 in the cavities 108. The bridge heat sinks 106 are configured to thermally engage the electronics packages 104 to dissipate heat that is generated and/or emitted by the electronics packages 104. The chassis 102 further includes a front plate 122 and a rear plate 124. In the illustrated embodiment, the rear plate 124 of the chassis 102 defines the rear 116 of the electronics system 100. The rear plate 124 is secured to a housing 126 that covers the front plate 122, the bridge heat sinks 106, and the electronics packages 104. The housing 126 is configured to provide a barrier to prevent or at least prohibit dust, dirt, debris, moisture, or other contaminants outside of the housing 126 from engaging the electronics packages 104.

Figure 2:
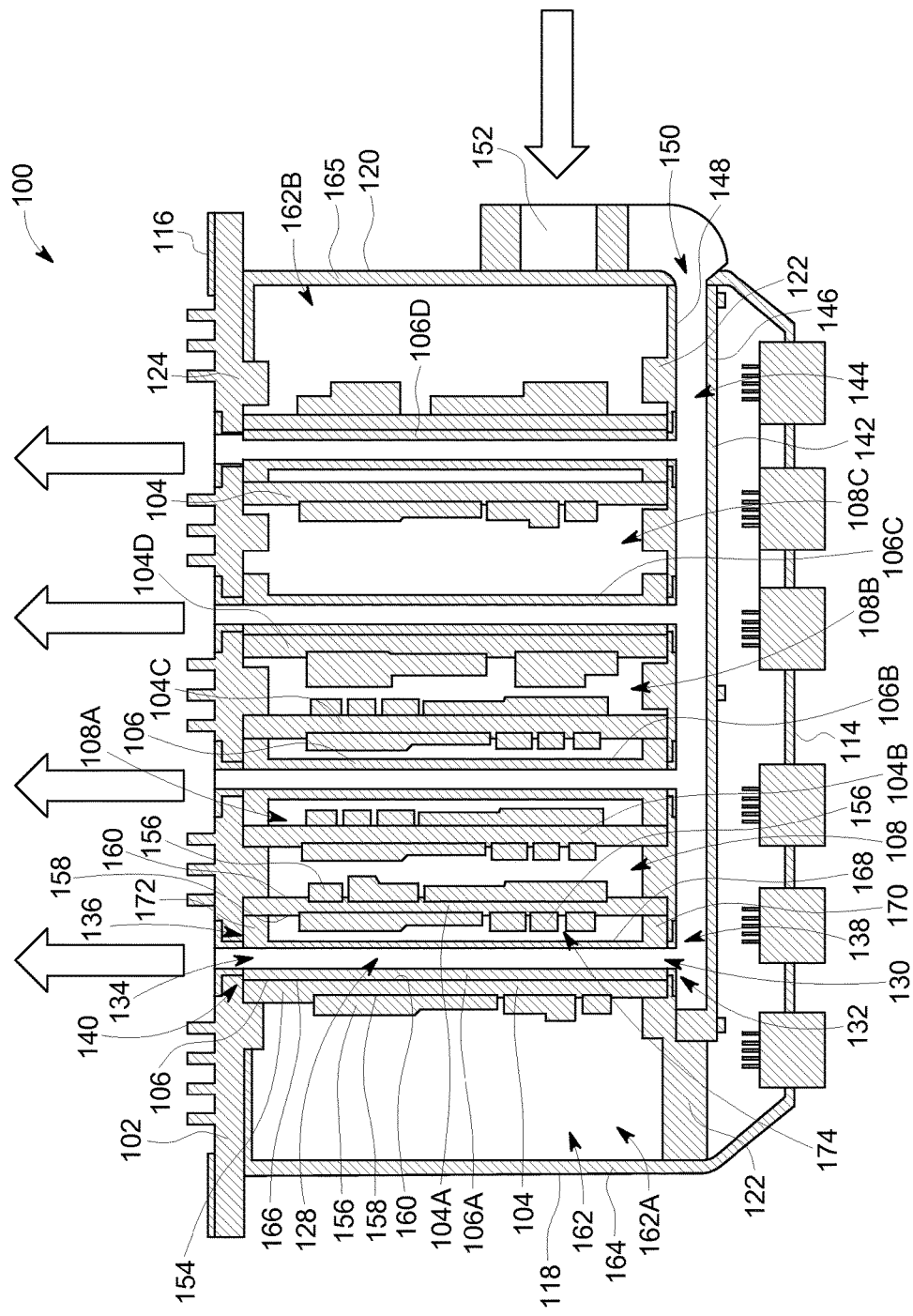
FIG. 2 illustrates a top cross-sectional view of the electronics system according to an embodiment.

FIG. 2 illustrates a cross-sectional view of the electronics system 100 along line 2-2 shown in FIG. 1 according to an embodiment. In the illustrated embodiment, the chassis 102 includes four bridge heat sinks 106, but the chassis 102 may include more than four or less than four bridge heat sinks 106 in other embodiments. Each bridge heat sink 106 extends between the front plate 122 and the rear plate 124. Each bridge heat sink 106 defines a fluid channel 128 through the respective heat sink 106. The fluid channels 128 extend longitudinally between a front opening 130 at a front end 132 of the respective bridge heat sink 106 and a rear opening 134 at a rear end 136 of the respective bridge heat sink 106. The fluid channels 128 receive a cooling fluid therethrough. In the illustrated embodiment, the cooling fluid is air. In other embodiments, the cooling fluid may be another gas at ambient conditions, such as hydrogen or an inert gas. Alternatively, the cooling fluid may be a liquid at ambient conditions, such as water (alone or in a solution with one or more other chemicals).

The front openings 130 of the bridge heat sinks 106 align with and are fluidly connected to slots 138 defined through the front plate 122. As used herein, two fluid-carrying components are fluidly connected to one another when substantially all of a fluid flowing from a first of the components towards the second component is received in the second component upon exiting the first component. The rear openings 134 of the bridge heat sinks 106 align with and are fluidly connected to slots 140 defined through the rear plate 124. Therefore, the chassis 102 defines multiple fluid paths longitudinally through the chassis 102. The fluid paths extend through the front plate 122, through the fluid channel 128 of a corresponding one of the bridge heat sinks 106, and through the rear plate 124.

Figure 3:
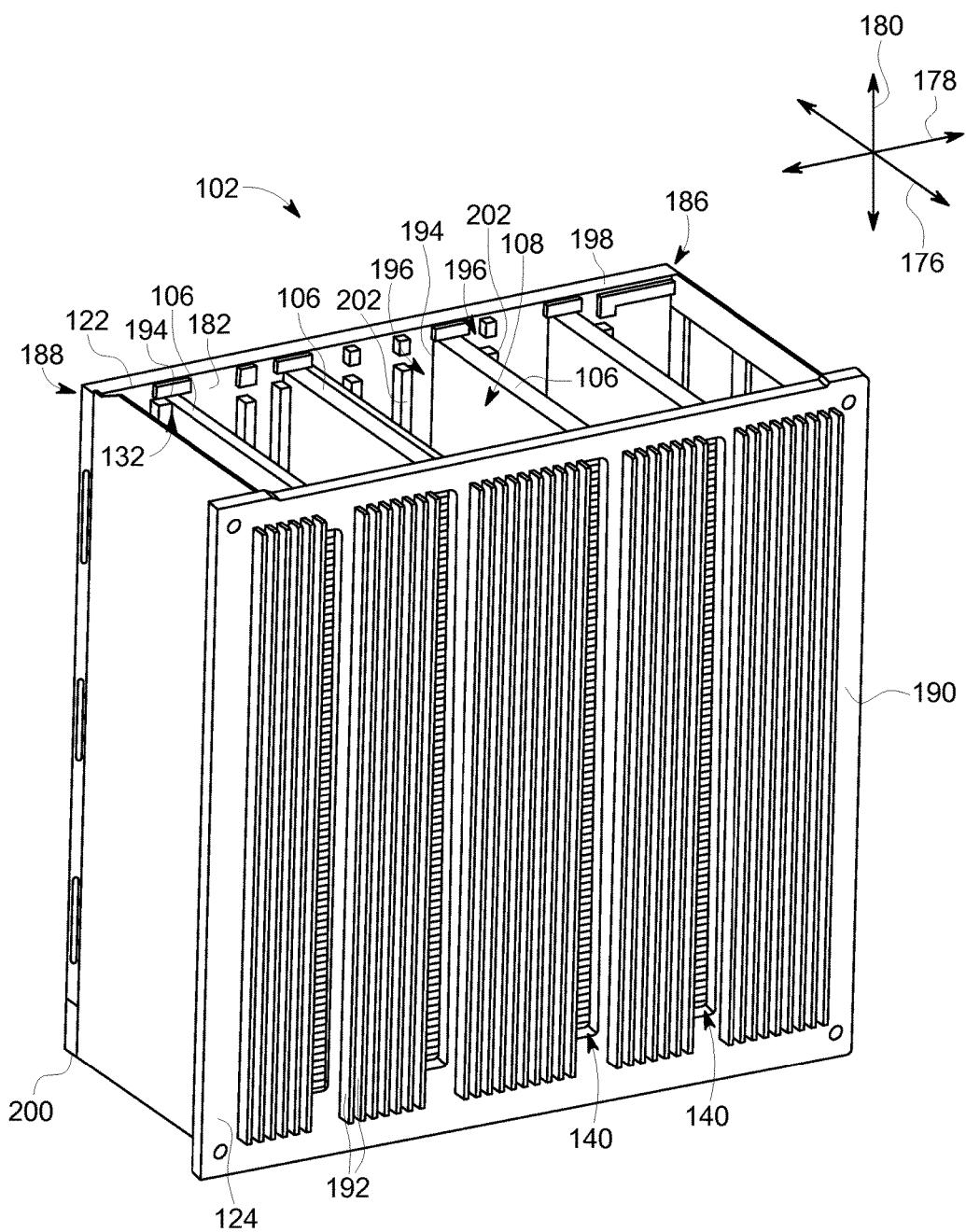
FIG. 3 is a rear perspective view of a chassis of the electronics system according to an embodiment.

In an embodiment, the front plate 122 is coupled to a manifold cover 142. The manifold cover 142 and the front plate 122 define a fluid distribution chamber 144. The fluid distribution chamber 144 extends longitudinally between a base wall 146 of the manifold cover 142 and a front side 148 of the front plate 122. The fluid distribution chamber 144 is configured to distribute cooling fluid from one or more input ports to one or more output ports. In the illustrated embodiment, the fluid distribution chamber 144 includes four output ports defined by the four slots 138 through the front plate 122. The fluid distribution chamber 144 shows one port opening 150 along one end of the manifold cover 142. Optionally, the fluid distribution chamber 144 may include more than one port opening 150 along the same end, such that the openings are stacked vertically relative to one another, as shown in FIG. 3. In another embodiment, the fluid distribution chamber 144 may define one or more port openings along the opposite end, along a top, and/or along a bottom of the manifold cover 142 instead of, or in addition to, the port opening 150.

In the illustrated embodiment, the cooling fluid is configured to flow through the port opening 150 into the fluid distribution chamber 144 before flowing through the slots 138 into the fluid channels 128 of the bridge heat sinks 106. The cooling fluid is discharged from the fluid channels 128 through the slots 140 of the rear plate 124. Optionally, the rear plate 124 of the chassis 102 may be open to the ambient environment such that the cooling fluid is exhausted to the ambient environment upon exiting the fluid channels 128 and flowing across the rear plate 124. In an embodiment, the cooling fluid is propelled through the port opening 150 by at least one fan 152. Alternatively, the cooling fluid may be passively directed to the port opening 150, such as by using ducts to direct wind experienced by a moving vehicle to the electronics system 100 onboard the moving vehicle. Although the illustrated embodiment shows the cooling fluid flowing from the front 114 of the electronics system 100 to the rear 116, it is recognized that the cooling fluid may flow in the opposite direction. For example, the cooling fluid may enter the chassis 102 through the slots 140 of the rear plate 124 and may exit through the port opening 150. The cooling fluid may enter the slots 140 of the chassis 102 without intervention or may be drawn into the chassis 102 by the fan 152.

The bridge heat sinks 106 are laterally spaced apart from one another along a width of the front plate 122 and along a width of the rear plate 124. A pair of adjacent bridge heat sinks 106 defines a corresponding cavity 108 therebetween. The cavities 108 are each configured to receive at least one electronics package 104 therein. The bridge heat sinks 106 are configured to thermally engage the electronics packages 104. As used herein, two components are "thermally engaged" with one another when a heat conduction path is formed between the two components such that heat is transferred from the component with a higher temperature to the component with a lower temperature. Two components that are thermally engaged may be in direct mechanical contact or engagement with one another, or may be separated by a conductive layer (e.g., an electrically conductive and/or thermally conductive layer), such as a thermal interface material that is applied at an interface between the two components.

In the example configuration of the electronics system 100 shown in FIG. 2, the chassis 102 includes four bridge heat sinks 106. A first cavity 108A is defined between a first bridge heat sink 106A and a second bridge heat sink 106B adjacent to the first bridge heat sink 106A. A second cavity 108B is defined between the second bridge heat sink 106B and a third bridge heat sink 106C adjacent to the second bridge heat sink 106B. The second bridge heat sink 106B is disposed laterally between the first and third bridge heat sinks 106A, 106C along the width of the front plate 122. In the illustrated embodiment, the first cavity 108A includes two electronics packages 104 therein. A first electronics package 104A in the first cavity 108A is disposed next to and is thermally engaged to the first bridge heat sink 106A. A second electronics package 104B is disposed between the first electronics package 104A and the second bridge heat sink 106B and is thermally engaged to the second bridge heat sink 106B. The second cavity 108B also includes two electronics packages 104. A third electronics package 104C in the second cavity 108B is thermally engaged to the second bridge heat sink 106B, and a fourth electronics package 104D is thermally engaged to the third bridge heat sink 106C. The second bridge heat sink 106B is therefore in thermal engagement with both the second electronics package 104B and the third electronics package 104C, which are located on opposite sides of the second bridge heat sink 106B. As such, the second bridge heat sink 106B is configured to receive or absorb heat generated by both the second and third electronics packages 104B, 104C and transfer the heat to the cooling fluid within the fluid channel 128 of the second bridge heat sink 106B.

In an embodiment, due to size constraints or a lack of electronics packages 104, one or more cavities 108 may include only one or zero electronics packages 104. For example, a third cavity 108C between the third bridge heat sink 106C and a fourth bridge heat sink 106D includes only one electronics package 104 in the illustrated embodiment. The chassis 102 optionally defines two end cavities 162 that are each configured to receive one electronics package 104 therein. A first end cavity 162A is defined laterally between the first bridge heat sink 106A and a side plate 164 of the housing 126 defining the first side 118 of the electronics system 100. A second end cavity 162B is defined laterally between the fourth bridge heat sink 106D and a side plate 165 of the housing 126 defining the second side 120 of the electronics system 100. Although only seven are shown, the illustrated chassis 102 may be configured to receive eight electronics packages 104 that are each thermally engaged with one of the bridge heat sinks 106 to transfer heat away from the electronics packages 104. In other embodiments, the chassis 102 may include more or less than four bridge heat sinks 106, and therefore may be configured to receive more or less than eight electronics packages 104.

In the illustrated embodiment, the electronics packages 104 include a thermally conductive panel 154 and electrical components 156 on the panel 154. The panel 154 includes a first side 158 and an opposite second side 160. The electrical components 156 may be mounted along the first side 158, along the second side 160, or along both sides 158, 160. The thermally conductive panel 154 may be a metal layer of a printed circuit board or may be a sheet metal layer that is not part of a circuit board. During use, the electrical components 156 generate heat. At least some of the heat is absorbed by the thermally conductive panel 154. The bridge heat sinks 106 are configured to thermally engage the thermally conductive panels 154 of the corresponding electronics packages 104.

The bridge heat sinks 106 include planar side walls on both sides of each bridge heat sink 106. The planar side walls are referred to in FIG. 2 as left planar side walls 166 and right planar side walls 168. The side walls 166, 168 face the electronics packages 104 in the cavities 108. The side walls 166, 168 are defined by thermally conductive plates that allow heat to transfer through the side walls 166, 168. The side walls 166, 168 extend for at least most of a height of the bridge heat sinks 106 between a top and a bottom of the bridge heat sinks 106. In an embodiment, some of the side walls 166, 168 are configured to abut the thermally conductive panel 154 of the corresponding electronics package 104, while others of the side walls 166, 168 are configured to be spaced apart from the thermally conductive panel 154 of the corresponding electronics package 104. For example, the left side wall 166 of the first bridge heat sink 106A abuts the thermally conductive panel 154 of the electronics package 104 in the first end cavity 162A. The electronics package 104 includes electrical components 156 disposed along the first side 158 of the panel 154, but not along the second side 160 of the panel 154. The left planar side wall 166 of the first bridge heat sink 160A abuts the second side 160 of the panel 154 in order to transfer heat from the panel 154 to the bridge heat sink 106A across an engagement interface that extends a full length of the panel 154.

The right planar side wall 168 of the first bridge heat sink 106A, however, does not engage the first electronics package 104A in the first cavity 108A. The first electronics package 104A includes electrical components 156 along both the first and second sides 158, 160 of the thermally conductive panel 154. Due to varying heights of the electrical components 156 off of the first side 158, poor thermal coupling, and/or the risk of damaging the electrical components 156, the right side wall 168 of the first bridge heat sink 106A does not abut the first electronics package 104A. The first bridge heat sink 106A includes a front ledge 170 at the front end 132 and a rear ledge 172 at the rear end 136 that both project beyond the right planar side wall 168 towards the electronics package 104A. The front and rear ledges 170, 172 extend a farther distance from the right side wall 168 than the height of the tallest electrical component 156 relative to the first side 158 of the electronics package 104A. The front and rear ledges 170, 172 are configured to engage the thermally conductive panel 154 of the first electronics package 104A while accommodating the electrical components 156 in a recess 174 defined between the front and rear ledges 170, 172 (such that the bridge heat sink 106A does not contact the electrical components 156). Therefore, the chassis 102 may be configured to accommodate and thermally engage both single-sided electronics packages 104 that have electrical components 156 on only one side of the panel 154 and double-sided electronics packages 104 that have electrical components 156 on both sides of the panel 154.

FIG. 3 is a rear perspective view of the chassis 102 of the electronics system 100 according to an embodiment. The chassis 102 is oriented along a longitudinal axis 176, a lateral axis 178, and a vertical axis 180 that are mutually perpendicular. The chassis 102 may have any orientation relative to gravity. In an embodiment, the front plate 122 and the rear plate 124 extend parallel to one another and parallel to the lateral axis 178. The bridge heat sinks 106 extend between a back side 182 of the front plate 122 and a front side 184 (shown in FIG. 4) of the rear plate 124. The bridge heat sinks 106 in an embodiment extend parallel to one another and parallel to the longitudinal axis 176. The bridge heat sinks 106 are laterally spaced apart along the width of the front plate 122 between a first end 186 and a second end 188 of the front plate 122 to define the cavities 108. Optionally, the bridge heat sinks 106 are not equally spaced along the width of the front plate 122 such that the cavities 108 do not all have the same lateral width. For example, the chassis 102 may define different cavity sizes in order to accommodate electronics packages 104 (shown in FIG. 2) of varying shapes and sizes. Optionally, at least some of the bridge heat sinks 106 may have different thicknesses (along the lateral axis 178) relative to other bridge heat sinks 106. In an alternative embodiment, the bridge heat sinks 106 extend at an oblique angle relative to the front and rear plates 122, 124 and/or relative to one another.

A back side 190 of the rear plate 124 is shown in FIG. 3. The multiple slots 140 of the rear plate 124 extend longitudinally through the rear plate 124 between the front side 184 (shown in FIG. 4) and the back side 190. The slots 140 are oriented to extend vertically (e.g., parallel to the vertical axis 180). The slots 140 align with and are fluidly connected to the fluid channels 128 (shown in FIG. 2) of the bridge heat sinks 106 such that substantially all of the cooling fluid flowing from the fluid channels 128 towards the rear plate 124 flows through the slots 140 upon exiting the fluid channels 128 and is ejected or discharged beyond the back side 190 of the rear plate 124. In an embodiment, the rear plate 124 defines an array of fins 192 that protrude rearward from the back side 190. The fins 192 are vertically-extending ribs in the illustrated embodiment, but the fins 192 may have other shapes, arrangements, and/or orientation in other embodiments. The fins 192 increase the surface area of the rear plate 124 that is exposed to an external environment, such as a cab of a locomotive or an outdoor environment, in order to dissipate heat from the chassis 102. The rear plate 124 therefore is a heat sink to increase the amount or rate of heat dissipated from the chassis 102. As described with reference to FIG. 4, the front plate 122 optionally may also be a heat sink.

The front ends 132 of the bridge heat sinks 106 engage the back side 182 of the front plate 122 to define respective front chassis joints 194. Although not shown, the rear ends 136 (shown in FIG. 2) of the bridge heat sinks 106 engage the front side 184 (shown in FIG. 4) of the rear plate 124 to define rear chassis joints. The bridge heat sinks 106 are joined to the front plate 122 at the front chassis joints 194, and are joined to the rear plate 124 at the rear chassis joints. In an embodiment, the chassis includes a metallic filler material (not shown) extending along the front chassis joints 194 and the rear chassis joints. The metallic filler material fuses or joins the bridge heat sinks 106 to the front and rear plates 122, 124 during a brazing process. For example, the metallic filler material is applied to and along the front chassis joints 194 at interfaces between the bridge heat sinks 106 and the front plate 122. During the brazing process, the metallic filler material is heated above its melting point and then allowed to cool, which fuses the bridge heat sinks 106 to the front plate 122. The bridge heat sinks 106 are joined to the rear plate 124 through the same or at least similar brazing process. After the brazing process which fuses the bridge heat sinks 106 to the front and rear plates 122, 124, the chassis 102 is a unitary, one-piece body or structure. In an embodiment, the metallic filler material also seals the front chassis joints 194 and the rear chassis joints to prevent cooling fluid from leaking into the cavities 108 and/or air or other gas in the cavities 108 from leaking into the fluid channels 128 (shown in FIG. 2).

In an embodiment, the bridge heat sinks 106 are fused to the front plate 122 and to the rear plate 124 via a dip-brazing process. In the dip-brazing process, the bridge heat sinks 106 are coupled to the front plate 122 and the rear plate 124, at least temporarily, using fasteners, such as dowel pins, clips, or the like. Then, the metallic filler material is applied to the front chassis joints 194 and to the rear chassis joints, and the entire chassis assembly is lowered into a hot salt bath. Upon removing the chassis assembly from the bath and allowing the chassis assembly to cool, the metallic filler material hardens and fuses the front joints 194 and the rear joints, forming a unitary, one-piece body of the chassis 102. In other embodiments, the bridge heat sinks 106 may be fused or joined to the front and rear plates 122, 124 via other processes, such as soldering or welding.

The bridge heat sinks 106, the front plate 122, and the rear plate 124 are composed of a thermally-conductive metallic material. For example, the bridge heat sinks 106 and the front and rear plates 122, 124 may all be formed of a common aluminum alloy. The aluminum alloy has a higher melting point than the brazing filler material such that the filler material melts but the aluminum alloy does not melt during the brazing process (or other heat-induced joining process). Alternatively, the bridge heat sinks 106, the front plate 122, and/or the rear plate 124 may be formed of different aluminum alloys or alloys that do not contain aluminum. The metallic filler material may be in the form of a paste, a powder, a slurry, a foil, a wire, a ribbon, a cream, or the like. The metallic filler material may be an alloy that includes one or more of copper, nickel, iron, silver, aluminum, silicon, gold, or the like.

The metallic filler material is thermally conductive and electrically conductive. Therefore, an electrically conductive path extends across the front chassis joints 194 between the front plate 122 and the bridge heat sinks 106 due to the electrically conductive filler material at the joints 194. The electrically conductive path also extends across the rear joints between the rear plate 124 and the bridge heat sinks 106. Thus, the chassis 102 may be used to provide an electrical ground circuit for the electronics packages 104 (shown in FIG. 2) mounted in the cavities 108. Furthermore, the electrically conductive properties of the chassis 102 allow the chassis 102 to provide electrical shielding for the electronics packages 104, such as to block at least some electromagnetic interference (EMI) and/or cross-talk from outside of the chassis 102 and/or between electronics packages 104 in different cavities 108 of the chassis 102.

In an embodiment, the front plate 122 of the chassis 102 defines multiple tracks 196 that extend generally vertically (e.g., along the vertical axis 180). The tracks 196 may extend along a majority of the height of the front plate 122 between a top 198 and a bottom 200 of the front plate 122. The tracks 196 receive the electronics packages 104 (shown in FIG. 2) therein to guide the electronics packages 104 into thermal engagement with the bridge heat sinks 106. The tracks 196 may also be used to mount the electronics packages 104 to the chassis 102, such as by securing the electronics packages 104 in the tracks 196. The front plate 122 may define two sets of tracks 196 in at least some of the cavities 108 between two bridge heat sinks 106 in order to receive two electronics packages 104 within the respective cavity 108. A first of the two tracks 196 is disposed proximate to one of the bridge heat sinks 106 that define the cavity 108, and the other track 196 is disposed proximate to the other bridge heat sink 106 defining the cavity 108. The tracks 196 each include at least one rail 202 that engages a corresponding electronics package 104 within the track 196. The rails 202 may be configured to engage the thermally conductive panels 154 (shown in FIG. 2) of the electronics packages 104. With additional reference to FIG. 2, the tracks 196 may include one rail 202 that engages the first side 158 of the panel 154, for example, to guide the second side 168 of the panel 154 into thermal engagement with the left side wall 166 or the front and rear ledges 170, 172 of the corresponding bridge heat sink 106. Alternatively, at least some of the tracks 196 may include more than one rail 202 in order to engage opposite sides of the electronics package 104.

Figure 4:
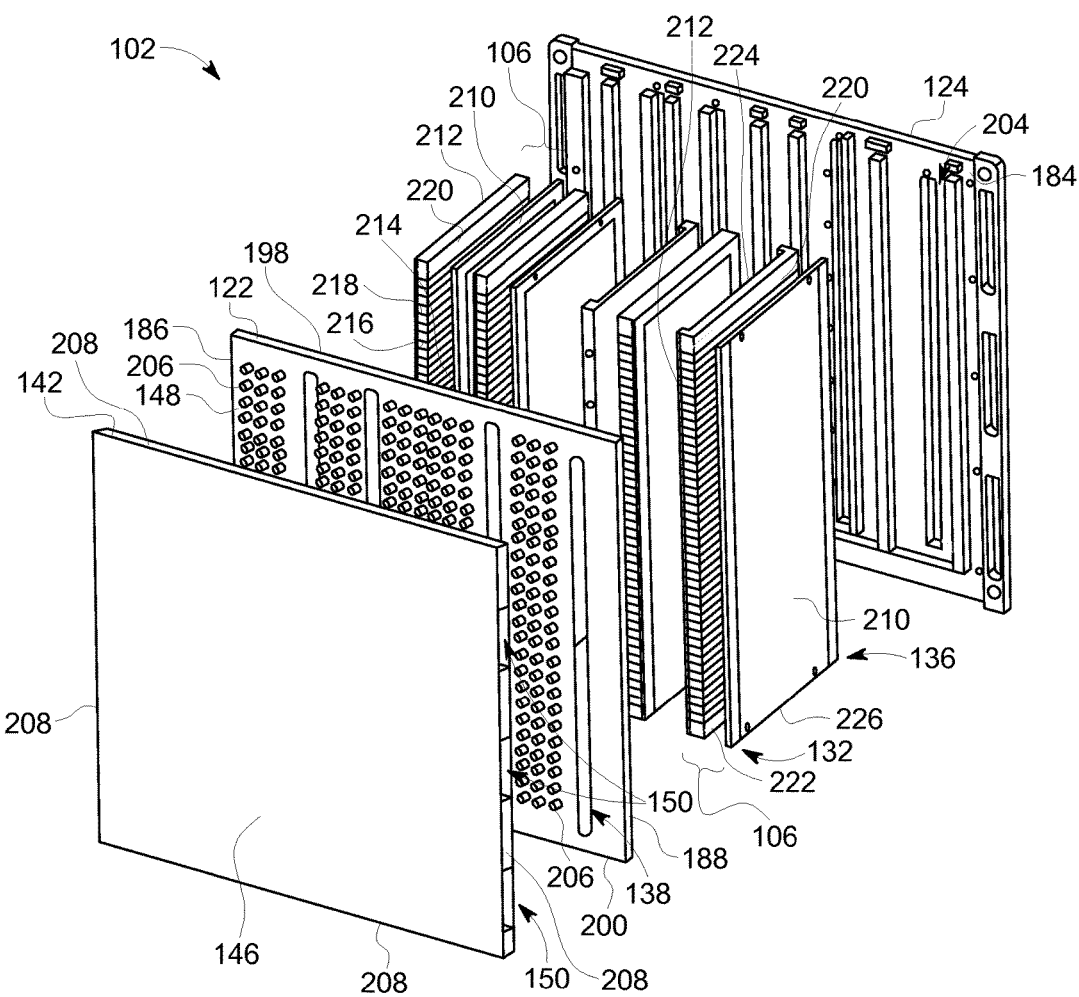
FIG. 4 is an exploded front perspective view of the chassis according to an embodiment.

Although not shown in FIG. 3, a fastener (e.g., a wedge lock fastener, a bolt, a clip, or the like) or an adhesive or glue may be used to secure the electronics package 104 (shown in FIG. 2) within the track 196. As shown in FIG. 4, the rear plate 124 may include tracks 204 that extend from the front side 184 of the rear plate 124. The tracks 204 may be complementary to the tracks 196 along the front plate 122. The electronics packages 104 may be mounted to the chassis 102 by securing the electronics packages 104 to the front plate 122, to the rear plate 124, and/or to the adjacent bridge heat sinks 106.

FIG. 4 is an exploded front perspective view of the chassis 102 according to an embodiment. The slots 138 of the front plate 122 extend vertically along the front plate 122. The front plate 122 includes an array of fins 206 that protrude from the front side 148 of the front plate 122. The fins 206 in the illustrated embodiment are pins or posts, but may have other shapes in other embodiments, such as ribs. The fins 206 extend into the fluid distribution chamber 144 (shown in FIG. 2) defined between the manifold cover 142 and the front side 148 of the front plate 122. The fins 206 increase the surface area of the front plate 122 that contacts the cooling fluid within the fluid distribution chamber 144 to increase heat dissipation from the electronics packages 104 (shown in FIG. 2) within the chassis 102 to the cooling fluid. Thus, the front plate 122 may be a heat sink in addition to the bridge heat sinks 106 and the rear plate 124.

In the illustrated embodiment, the manifold cover 142 has a box-shape including the rectangular base wall 146 and four side walls 208 that extend from edges of the base wall 146 to the front plate 122. Each of the side walls 208 is configured to be secured to one of the top 198, bottom 200, the first end 186, or the second end 188 of the front plate 122 to mount the manifold cover 142 to the front plate 122. When mounted to the front plate 122, the base wall 146 is spaced apart from the front side 148 of the front plate 122 to define the fluid distribution chamber 144 (shown in FIG. 2). The fluid distribution chamber 144 is also defined along a lateral and vertical plane by the four side walls 208 of the manifold cover 142. In the illustrated embodiment, the manifold cover 142 defines three port openings 150 along the side wall 208 that engages the second end 188 of the front plate 122. Optionally, the other side walls 208 do not define port openings 150 such that cooling fluid enters the fluid distribution chamber 144 from one side of the manifold cover 142. In other embodiments, the port openings 150 may be located along one or more different sides of the manifold cover 142. The manifold cover 142 may be composed of a metallic material, such as the aluminum alloy used to form the front plate 122. In an embodiment, the manifold cover 142 is fused to the front plate 122 via brazing, welding, soldering, or the like. For example, the metallic filler material may be applied to interfaces between the front plate 122 and the manifold cover 142, and the combination may be brazed to fuse the front plate 122 to the manifold cover 142. The interfaces may extend along the top 198, bottom 200, first end 186, and second end 188 of the front plate 122.

In an embodiment, each of the bridge heat sinks 106 are defined by a base plate 210 and a fin plate 212 that are secured together. The base plate 210 and the fin plate 212 each define one of the left and right side walls 166, 168 (shown in FIG. 2) of the bridge heat sink 106. The fluid channel 128 (shown in FIG. 2) of the bridge heat sink 106 is defined between an interior surface 214 of the base plate 210 and an interior surface 216 of the fin plate 212. The fin plate 212 includes plural fins 218 that extend from the interior surface 216 towards the interior surface 214 of the base plate 210. The fins 218 in the illustrated embodiment are ribs that each extends longitudinally between the front end 132 and the rear end 136 of the respective bridge heat sink 106. Distal ends of the fins 218 may or may not engage the interior surface 214 of the base plate 210. In the illustrated embodiment, the base plate 210 does not include fins, but in an alternative embodiment both plates 210, 212 define fins.

The base plate 210 and the fin plate 212 engage one another along a top interface 220 at or proximate to a top 224 of the bridge heat sink 106 and along a bottom interface 222 at or proximate to a bottom 226 of the bridge heat sink 106. The base plate 210 may be joined or fused to the fin plate 212 at the top and bottom interfaces 220, 222 through a brazing, welding, or soldering process to form a unitary, one-piece bridge heat sink 106. For example, the base plate 210 and the fin plate 212 may be formed of one or more metallic materials, such as an aluminum alloy. The base plate 210 may be coupled to the fin plate 212, and a metallic filler material may be applied at the top and bottom interfaces 220, 222. The coupled plates 210, 212 may then be brazed, such as via dip-brazing, to fuse the plates 210, 212 together, forming the unitary bridge heat sink 106. The filler material also seals the top and bottom interfaces 220, 222, preventing the passage of fluids across the interfaces 220, 222. Thus, the bridge heat sinks 106 in an embodiment may be sealed along the top 224 and the bottom 226, but open along the front end 132 and the rear end 136 to define the front and rear openings 130, 134 (shown in FIG. 2) of the bridge heat sinks 106.

Figure 5:
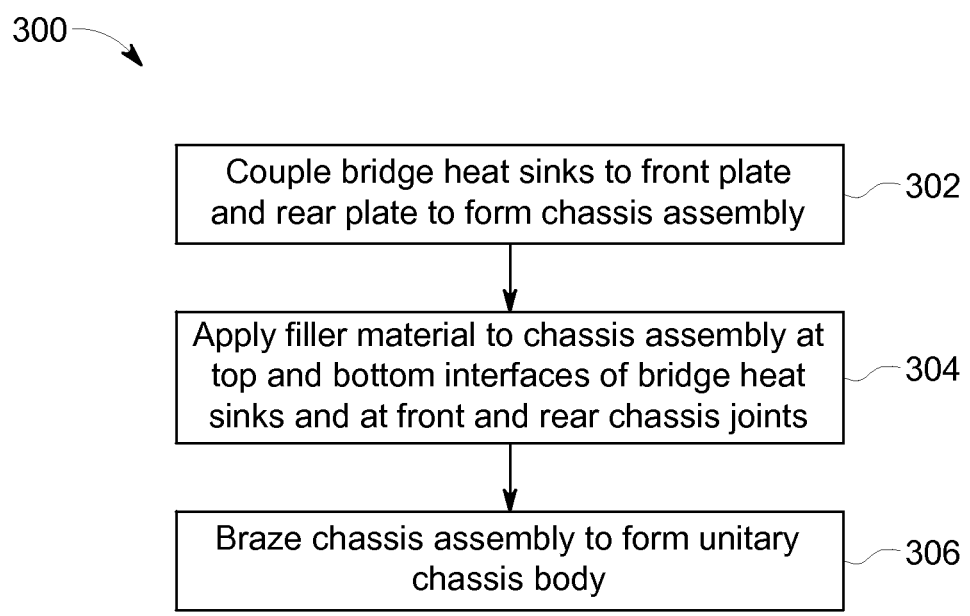
FIG. 5 is a flow chart of one embodiment of a method for forming a heat transfer chassis.

FIG. 5 is a flow chart of one embodiment of a method 300 for forming a heat transfer chassis for an electronics system that includes plural electronics packages held in the chassis. At 302, multiple bridge heat sinks are coupled to a front plate and to a rear plate to form a chassis assembly. The bridge heat sinks are positioned between the front plate and the rear plate. The bridge heat sinks each include a base plate and a fin plate that engage one another at a respective top interface and a respective bottom interface. The respective base and fin plates of each bridge heat sink define a fluid channel laterally therebetween that extends through the bridge heat sink. More specifically, the fluid channel may be defined between an interior surface of the base plate and an interior surface of the fin plate. The fluid channel extends longitudinally between a front end and a rear end of the respective bridge heat sink. As part of the coupling process, the base plate of each bridge heat sink is aligned with and coupled to the respective fin plate. The base and fin plates are coupled together, at least temporarily, to hold the base plate in position relative to the fin plate during a subsequent heat application. The base plate may be coupled to the fin plate using pins, clips, clamps, an adhesive or glue, or the like.

The chassis assembly may be assembled using fasteners (e.g., pins, clips, clamps, or the like) and/or adhesives or glue to couple the bridge heat sinks between the front and rear plates. In the chassis assembly, the front ends of the bridge heat sinks engage the front plate, and the rear ends of the bridge heat sinks engage the rear plate. The bridge heat sinks are positioned such that front openings of the fluid channels align with and are fluidly connected to corresponding front slots defined through the front plate, and rear openings of the fluid channels align with and are fluidly connected to corresponding rear slots defined through the rear plate. The bridge heat sinks are laterally spaced apart from one another along widths of the front and rear plates. Each pair of adjacent bridge heat sinks defines a corresponding cavity therebetween. The cavity is configured to receive at least one electronics package therein. The bridge heat sinks are configured to thermally engage the electronics packages in the cavities to absorb and dissipate heat generated by the electronics packages.

At 304, a metallic filler material is applied to the chassis assembly at the top and bottom interfaces of the bridge heat sinks and at front and rear chassis joints of the chassis assembly. The front chassis joints are defined between the front ends of the bridge heat sinks and a back side of the front plate. The rear chassis joints are defined between the rear ends of the bridge heat sinks and a front side of the rear plate. The metallic filler material may be formed of a metal alloy that includes one or more of copper, nickel, iron, silver, aluminum, silicon, gold, or the like. The metallic filler material may be applied to the chassis assembly as a paste, a powder, a slurry, a foil, a wire, a ribbon, a cream, or the like. The metallic brazing material is applied to the chassis joints prior to or during a heat application. The metallic filler material has a lower melting point temperature than the other components of the chassis assembly. For example, the bridge heat sinks (including the base plates and fin plates thereof), the front plate, and the rear plate may be composed of an aluminum alloy that has a higher melting point temperature than the metallic filler material. The temperature of a brazing bath (described below with reference to step 306) may be higher than the melting point temperature of the filler material but lower than the melting point temperature of the aluminum alloy. The metallic filler material may be applied along the lengths of the top and bottom interfaces of each of the bridge heat sinks to seal the interfaces. The metallic filler material may also be applied along the lengths of the front and rear chassis joints to seal the interfaces between the bridge heat sinks and the front and rear plates, respectively.

At 306, the chassis assembly is brazed or heated to form a unitary chassis body. The chassis assembly may be brazed via torch brazing, a furnace brazing, or dip brazing. In dip brazing, the chassis assembly, in the assembled arrangement, is submerged in a hot bath of molten salt. The bath melts the metallic filler material without melting the bridge heat sinks (including the base plates and fin plates) or the front and rear plates. The filler material fills the top and bottom interfaces and the front and rear chassis joints. Upon removing the chassis assembly from the heat (e.g., pulling the chassis assembly out of the bath), the filler material cools and solidifies, fusing the base plates to the respective fin plates to form each of the bridge heat sinks as a unitary, one-piece member. The cooling and solidifying filler material also fuses the bridge heat sinks to the front plate and to the rear plate at the front and rear chassis joints, respectively. In response to the bridge heat sinks fusing to the front and rear plates, the chassis assembly has a unitary, one-piece chassis body. The unitary chassis body after the brazing step may be equivalent to a body that is originally molded as one integral metal body (instead of multiple discrete metal components). The metallic filler material seals the front and rear chassis joints to prevent fluids from leaking through the chassis joints. In an embodiment, the metallic filler material is electrically conductive and thermally conductive. Thus, the filler material may provide electromagnetic interference (EMI) shielding for the electronics packages and may also provide a conductive path that connects the bridge heat sinks and the front and rear plates, allowing the chassis to define a ground circuit to electrically common grounding elements of the electronics packages.

Optionally, brazing the chassis assembly may also include brazing a manifold cover to the front plate. The manifold cover is box-shaped and includes a base wall and four side walls that extend from edges of the base wall. The metallic filler material may be applied at interfaces between the four side walls of the manifold cover and the front plate, and during the brazing process the manifold cover fuses to the front plate to define a fluid distribution chamber within the four side walls between the base wall and a front side of the front plate. The fluid distribution chamber is configured to aggregate or distribute the cooling fluid relative to the fluid channels of the bridge heat sinks.

After forming the heat transfer chassis, the method 300 may further include loading a first electronics package into one of the cavities between one pair of adjacent bridge heat sinks. The first electronics package thermally engages a first bridge heat sink of the pair such that the first bridge heat sink receives heat emitted from the first electronics package and passively transfers the heat to a cooling fluid within the fluid channel of the first bridge heat sink. In addition, a second electronics package may be loaded into the same cavity between the first electronics package and a second bridge heat sink of the pair of adjacent bridge heat sinks. The second electronics package thermally engages the second bridge heat sink such that the second bridge heat sink receives heat emitted from the second electronics package and passively transfers the heat to the cooling fluid within the fluid channel of the second bridge heat sink.

In an alternative embodiment, the bridge heat sinks may be formed prior to the brazing step in 306 above. For example, the base plates may be brazed to the respective fin plates to form the bridge heat sinks in a separate brazing process prior to step 306. In another example, the bridge heat sinks may be formed by an extrusion process, a different welding process, or the like, prior to being coupled to the front and rear plates to form the chassis assembly.

In an embodiment, a system (e.g., a heat transfer chassis) includes a front plate, a manifold cover, and bridge heat sinks. The front plate has a front side and a back side. The front plate defines multiple slots through the front plate between the front and back sides. The manifold cover is secured to the front plate to define a fluid distribution chamber along the front side of the front plate. The manifold cover defines a port opening through which a cooling fluid is received from outside of the manifold cover. The bridge heat sinks extend rearward from the back side of the front plate. The bridge heat sinks define fluid channels that are fluidly connected with the fluid distribution chamber through the corresponding slots of the front plate. The fluid distribution chamber is configured to distribute the cooling fluid received from outside of the manifold cover through the fluid channels of the bridge heat sinks in order to cool one or more electronics packages disposed along the bridge heat sinks without the cooling fluid engaging the one or more electronics packages.

In an aspect, the fluid distribution chamber is configured to receive ambient air as the cooling fluid.

In an aspect, the front plate and the bridge heat sinks are electrically conductive. The front plate is joined to the bridge heat sinks at respective front chassis joints that are also electrically conductive. The front plate and the bridge heat sinks define a ground path that extends across the front chassis joints to electrically ground at least one of the one or more electronics packages to an electronic ground reference.

In an aspect, the bridge heat sinks are spaced apart from each other along a width of the front plate to define cavities between adjacent bridge heat sinks that are shaped and sized to receive the one or more electronics packages.

In an aspect, the cavity defined between a pair of adjacent bridge heat sinks is configured to receive two electronics packages such that a first bridge heat sink of the pair is thermally engaged with one of the two electronics packages to cool the one electronics package and a second bridge heat sink of the pair is thermally engaged with the other of the two electronics packages to cool the other electronics package.

In an aspect, each of the bridge heat sinks includes a base plate and a fin plate joined together to define the respective bridge heat sink. The base plate is joined to the fin plate along a top interface and a bottom interface. The fluid channel of each bridge heat sink is defined laterally between respective interior surfaces of the base plate and the fin plate. The fin plate includes plural fins that protrude from the interior surface of the fin plate towards the base plate.

In an aspect, the bridge heat sinks include a metallic filler material disposed along the top interfaces and the bottom interfaces between the respective base plates and the fin plates. The metallic filler material on each bridge heat sink is configured to fuse the base plate to the fin plate and seal the top and bottom interfaces responsive to a heat application at one or more temperatures above a melting point of the metallic filler material and below respective melting points of the base plate and the fin plate.

In an aspect, the bridge heat sinks extend longitudinally between front ends and rear ends. The front ends of the bridge heat sinks are joined to the front plate. The system further includes a rear plate joined to the rear ends of the bridge heat sinks. The rear plate defines multiple slots therethrough. The fluid channels of the bridge heat sinks at the rear ends are fluidly connected to the corresponding slots of the rear plate such that the cooling fluid is discharged through the slots of the rear plate upon exiting the fluid channels.

In an aspect, the front plate includes an array of fins that protrude from the front side of the front plate and the rear plate includes an array of fins that protrude from a back side of the rear plate.

In an aspect, the manifold cover includes a base wall and multiple side walls that extend from edges of the base wall to the front plate. The fluid distribution chamber is at least partially defined between the base wall and the front side of the front plate. The port opening of the manifold cover extends through one of the side walls.

In an aspect, front ends of the bridge heat sinks engage the back side of the front plate at respective front chassis joints. The system further includes a metallic filler material disposed along the front chassis joints. The metallic filler material is configured to fuse the bridge heat sinks to the front plate and seal the front chassis joints responsive to a heat application at one or more temperatures above a melting point of the metallic filler material and below respective melting points of the front plate and the bridge heat sinks.

In an aspect, the bridge heat sinks include planar side walls that face the one or more electronics packages. The planar side wall of at least one of the bridge heat sinks abuts a thermally conductive panel of a corresponding adjacent electronics package to thermally engage the adjacent electronics package via face-to-face conduction.

In an aspect, the bridge heat sinks include a planar side walls that face the one or more electronics packages. At least one of the bridge heat sinks includes a front ledge at a front end of the respective bridge heat sink and a rear ledge at a rear end of the respective bridge heat sink. The front and rear ledges project beyond the planar side wall of the respective bridge heat sink and abutting a thermally conductive panel of a corresponding adjacent electronics package to thermally engage the electronics package via edge-to-edge conduction without the planar side wall engaging the electronics package.

In an aspect, the bridge heat sinks extend parallel to one another and generally perpendicular to the front plate.

In an aspect, the bridge heat sinks extend longitudinally between front ends and rear ends. The front ends of the bridge heat sinks are joined to the front plate. The system further includes a rear plate joined to the rear ends of the bridge heat sinks. The rear plate defines multiple slots therethrough. The fluid channels of the bridge heat sinks at the rear ends are fluidly connected to the corresponding slots of the rear plate such that the cooling fluid is discharged through the slots of the rear plate upon exiting the fluid channels. The front plate and the bridge heat sinks are electrically conductive. The front plate is joined to the bridge heat sinks at respective front chassis joints that are also electrically conductive. The front plate and the bridge heat sinks define a ground path that extends across the front chassis joints to electrically ground at least one of the one or more electronics packages to an electronic ground reference. The bridge heat sinks extend parallel to one another and generally perpendicular to the front plate and are spaced apart from each other along a width of the front plate and the rear plate to define cavities between adjacent bridge heat sinks that are shaped and sized to receive the one or more electronics packages.

In an aspect, front ends of the bridge heat sinks engage the back side of the front plate at respective front chassis joints. The bridge heat sinks are fused to the front chassis joints by a fused metallic filler material disposed along the front chassis joints. The metallic filler material has a melting point above an operational temperature of the system and below respective melting points of the front plate and the bridge heat sinks.

In another embodiment, a method (e.g., for forming a heat transfer chassis) includes coupling a plurality of bridge heat sinks between a front plate and a rear plate to form a chassis assembly. The bridge heat sinks each include a base plate and a fin plate that engage one another at a respective top interface and a respective bottom interface and define a fluid channel laterally therebetween that extends through the bridge heat sink. Front openings of the fluid channels of the bridge heat sinks are fluidly connected to corresponding front slots defined through the front plate. Rear openings of the fluid channels are fluidly connected to corresponding rear slots defined through the rear plate. The bridge heat sinks are laterally spaced apart from one another to define cavities between pairs of adjacent bridge heat sinks. The method also includes applying a metallic filler material to the chassis assembly at the top interfaces and the bottom interfaces of the bridge heat sinks and at front and rear chassis joints of the chassis assembly. The front chassis joints are defined between the bridge heat sinks and the front plate. The rear chassis joints are defined between the bridge heat sinks and the rear plate. The method further includes brazing the chassis assembly to form a unitary chassis body. The metallic filler material fuses the base plates to the respective fin plates of the bridge heat sinks at the respective top and bottom interfaces. The metallic filler material fuses the bridge heat sinks to the front plate and to the rear plate at the front chassis joints and rear chassis joints, respectively.

In an aspect, the method further includes distributing a cooling fluid received from outside of the front plate through the front slots and into the fluid channels of the bridge heat sinks in order to cool one or more electronics packages disposed along the bridge heat sinks.

In an aspect, the method further includes loading first electronics package and a second electronics package into a corresponding cavity defined between one pair of adjacent bridge heat sinks. The first electronics package is disposed proximate to a first bridge heat sink of the pair and the second electronics package disposed between the first electronics package and a second bridge heat sink of the pair. The first bridge heat sink is configured to cool the first electronics package by transferring heat received from the first electronics package to a cooling fluid within the fluid channel of the first bridge heat sink. The second bridge heat sink is configured to cool the second electronics package by transferring heat received from the second electronics package to the cooling fluid within the fluid channel of the second bridge heat sink.

In an aspect, the metallic filler material is electrically conductive and thermally conductive.

In an aspect, the method further includes coupling a manifold cover to the front plate to define a fluid distribution chamber. The fluid distribution chamber is configured to receive a cooling fluid therein from outside of the manifold cover through a port opening and distribute the cooling fluid through the fluid channels of the bridge heat sinks to cool one or more electronics packages disposed along the bridge heat sinks without the cooling fluid engaging the one or more electronics packages.

In an aspect, the front plate, the rear plate, and both of the base plates and the fin plates of the bridge heat sinks are composed of an aluminum alloy. The metallic filler material has a lower melting point than the aluminum alloy.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the subject matter described herein without departing from its scope. While the dimensions and types of materials described herein are intended to define the parameters of the disclosed subject matter, they are by no means limiting and are exemplary embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the inventive subject matter, including the best mode, and also to enable a person of ordinary skill in the art to practice the embodiments of inventive subject matter, including making and using any devices or systems and performing any incorporated methods. The patentable scope of the inventive subject matter is defined by the claims, and may include other examples that occur to a person of ordinary skill in the art. Such other examples are intended to be within the scope of the claims if they have structural elements that do not differ from the literal language of the claims, or if they include equivalent structural elements with insubstantial differences from the literal languages of the claims.

Since certain changes may be made in the above-described systems and methods, without departing from the spirit and scope of the inventive subject matter herein involved, it is intended that all of the subject matter of the above description or shown in the accompanying drawings shall be interpreted merely as examples illustrating the inventive concept herein and shall not be construed as limiting the inventive subject matter.

What is claimed is:

1. A system comprising:
a front plate having multiple slots therethrough and multiple cooling fins located between the slots;
a manifold cover secured to the front plate to define a fluid distribution chamber along the front plate, the manifold cover defining a port opening through which a cooling fluid is received from outside of the manifold cover;
a rear plate spaced apart from the front plate, the rear plate having multiple slots therethrough that are aligned with the slots in the front plate along directions that extend from the front plate to the rear plate; and
bridge heat sinks extending away from the front plate and toward the rear plate, the bridge heat sinks defining multiple separate fluid channels that are aligned with and fluidly connected with the fluid distribution chamber through the slots in the front plate, the cooling fins of the front plate spaced apart from the bridge heat sinks, wherein each of the separate fluid channels is aligned with and fluidly coupled with a different slot of the slots in the rear plate,
wherein the fluid distribution chamber is configured to distribute the cooling fluid received from outside of the manifold cover through the fluid channels of the bridge heat sinks in order to cool one or more electronics packages disposed along the bridge heat sinks,
wherein the slots in the rear plate are positioned to separately direct different portions of the cooling fluid out of the rear plate without mixing the different portions of the cooling fluid inside the rear plate.

2. The system of claim 1, wherein the fluid distribution chamber is configured to receive ambient air as the cooling fluid.

3. The system of claim 1, wherein the front plate and the bridge heat sinks are electrically conductive, the front plate being joined to the bridge heat sinks at respective front chassis joints that are also electrically conductive, the front plate and the bridge heat sinks defining a ground path that extends across the front chassis joints to electrically ground at least one of the one or more electronics packages to an electronic ground reference.

4. The system of claim 1, wherein the bridge heat sinks are spaced apart from each other along a width of the front plate to define one or more cavities between adjacent bridge heat sinks that are shaped and sized to receive the one or more electronics packages.

5. The system of claim 4, wherein the one or more cavities defined between the bridge heat sinks are configured to receive two or more of the electronics packages such that a first bridge heat sink of the bridge heat sinks is thermally engaged with a first electronics package of the two or more electronics packages and a second bridge heat sink of the bridge heat sinks is thermally engaged with a second electronics package of the two or more electronics packages.

6. The system of claim 1, wherein at least one of the bridge heat sinks includes a base plate and a fin plate joined together to define the fluid channel of the at least one bridge heat sink, the base plate being joined to the fin plate along a top interface and a bottom interface, the fin plate including plural fins that protrude from an interior surface of the fin plate toward the base plate.

7. The system of claim 6, wherein the at least one bridge heat sink includes a metallic filler material disposed along the top interface and the bottom interface between the base plate and the fin plate, the metallic filler material configured to fuse the base plate to the fin plate and seal the top and bottom interfaces responsive to application of heat at one or more temperatures above a melting point of the metallic filler material and below one or more melting points of the base plate and the fin plate.

8. The system of claim 1, wherein the rear plate includes an array of fins that protrude from the rear plate.

9. The system of claim 1, wherein the manifold cover includes a base wall and multiple side walls that extend from edges of the base wall to the front plate, the fluid distribution chamber being at least partially defined between the base wall and the front side of the front plate, the port opening of the manifold cover extending through one of the side walls.

10. The system of claim 1, wherein front ends of the bridge heat sinks engage the front plate at respective front chassis joints, and further including a metallic filler material disposed along the front chassis joints, the metallic filler material configured to fuse the bridge heat sinks to the front plate and seal the front chassis joints responsive to an application of heat at one or more temperatures above a melting point of the metallic filler material and below one or more melting points of the front plate and the bridge heat sinks.

11. The system of claim 1, wherein the bridge heat sinks include side walls that face the one or more electronics packages, the side wall of at least one of the bridge heat sinks configured to thermally engage at least one of the electronics packages by abutting a thermally conductive panel of the at least one electronics package.

12. The system of claim 1, wherein the bridge heat sinks include side walls and at least one of the bridge heat sinks includes a front ledge at a front end of the at least one bridge heat sink and a rear ledge at a rear end of the at least one bridge heat sink, the front and rear ledges projecting beyond the side wall of the at least one bridge heat sink and configured to abut a thermally conductive panel of at least one of the electronics packages without the side wall engaging the at least one electronics package.

13. The system of claim 1, wherein the bridge heat sinks extend parallel to one another and generally perpendicular to the front plate.

14. The system of claim 1, wherein the bridge heat sinks extend longitudinally between front ends and rear ends, the front ends of the bridge heat sinks joined to the front plate,
wherein the front plate and the bridge heat sinks are electrically conductive, the front plate being joined to the bridge heat sinks at respective front chassis joints that also are electrically conductive, the front plate and the bridge heat sinks defining a ground path that extends across the front chassis joints to electrically ground at least one of the electronics packages to an electronic ground reference; and
wherein the bridge heat sinks extend parallel to one another and generally perpendicular to the front plate and are spaced apart from each other along a width of the front plate and the rear plate to define cavities between adjacent bridge heat sinks that are shaped and sized to receive the one or more electronics packages.

15. The system of claim 1, wherein front ends of the bridge heat sinks engage the front plate at respective front chassis joints, the bridge heat sinks being fused to the front chassis joints by a fused metallic filler material disposed along the front chassis joints, the metallic filler material having a melting point above an operational temperature of the system and below one or more melting points of the front plate and the bridge heat sinks.

16. The system of claim 1, wherein the cooling fins of the front plate extend into the fluid distribution chamber towards the manifold cover.

17. A method comprising:
coupling a plurality of bridge heat sinks between a front plate and a rear plate to form a chassis assembly, the bridge heat sinks each including a fluid channel that extends through the bridge heat sink from the front plate to the rear plate, the fluid channels of the bridge heat sinks being individually fluidly coupled with different front slots through the front plate, wherein the bridge heat sinks are coupled with the rear plate so that different fluid channels of the fluid channels in the bridge heat sinks are aligned with different slots in the rear plate that are positioned to separately direct different portions of cooling fluid flowing through the fluid channels out of the rear plate and out of the chassis assembly without mixing the different portions of the cooling fluid inside the rear plate;
applying a metallic filler material to the chassis assembly at interfaces between the bridge heat sinks and the front and rear plates;
brazing the chassis assembly to form a unitary chassis body, the metallic filler material fusing the bridge heat sinks to the front plate and to the rear plate; and
coupling a manifold cover to the front plate to define a fluid distribution chamber, the fluid distribution chamber being configured to receive the cooling fluid therein from outside of the manifold cover through a port opening and distribute the cooling fluid through the fluid channels of the bridge heat sinks, wherein the front plate includes multiple cooling fins located between the front slots thereof and spaced apart from the bridge heat sinks, the cooling fins extending into the fluid distribution chamber towards the manifold cover.

18. The method of claim 17, further comprising distributing the cooling fluid received from outside of the front plate through the slots in the front plate and into the fluid channels of the bridge heat sinks in order to cool one or more electronics packages disposed along the bridge heat sinks.

19. The method of claim 17, further comprising loading a first electronics package and a second electronics package into a corresponding cavity defined between the bridge heat sinks, the first electronics package disposed proximate to a first bridge heat sink of the bridge heat sinks and the second electronics package disposed between the first electronics package and a second bridge heat sink of the bridge heat sinks, the first bridge heat sink configured to cool the first electronics package by transferring heat received from the first electronics package to the cooling fluid within the fluid channel of the first bridge heat sink and the second bridge heat sink configured to cool the second electronics package by transferring heat received from the second electronics package to the cooling fluid within the fluid channel of the second bridge heat sink.

20. The method of claim 17, wherein the metallic filler material is electrically conductive and thermally conductive.

21. The method of claim 17, wherein the front plate, the rear plate, and the bridge heat sinks include an aluminum alloy, the metallic filler material having a lower melting point than the aluminum alloy.

22. A chassis assembly comprising:
elongated bridge heat sinks having fluid channels configured to cool electronics packages by directing flow of a cooling fluid from a common source through the bridge heat sinks;
a front plate including slots through which the cooling fluid is distributed among the bridge heat sinks and into the fluid channels of the bridge heat sinks, the front plate including multiple cooling fins spaced apart from the slots and the bridge heat sinks;
a manifold cover secured to the front plate to define a fluid distribution chamber along the front plate, the manifold cover defining a port opening through which the cooling fluid is received from outside of the manifold cover; and
a rear plate including slots that are fluidly coupled with the fluid channels in the bridge heat sinks and with the slots in the front plate by the fluid channels in the bridge heat sinks, the rear plate including a separate slot of the slots for each of the bridge heat sinks, wherein the slots in the rear plate separately direct the cooling fluid flowing through each of the fluid channels in the bridge heat sinks out of the rear plate and into an ambient environment outside of the chassis assembly without mixing the cooling fluid in the rear plate.

* * * * *